United States Patent [19]

Song

[11] Patent Number: 5,074,817
[45] Date of Patent: Dec. 24, 1991

[54] METHOD FOR MANUFACTURING AN ELECTROLUMINESCENCE DISPLAY

[75] Inventor: Jun-ho Song, Seoul, Rep. of Korea

[73] Assignee: Samsung Electron Devices Co., Ltd., Kyunggi, Rep. of Korea

[21] Appl. No.: 578,791

[22] Filed: Sep. 7, 1990

[30] Foreign Application Priority Data

Sep. 7, 1989 [KR] Rep. of Korea ............... 89-12973

[51] Int. Cl.[5] .............................................. H01J 1/62
[52] U.S. Cl. ........................................ 445/24; 427/66; 313/509
[58] Field of Search ................ 427/66; 313/503, 509; 445/24

[56] References Cited

U.S. PATENT DOCUMENTS

| | | | |
|---|---|---|---|
| 4,201,797 | 5/1980 | Houtkamp | 427/66 |
| 4,751,427 | 6/1988 | Barrow et al. | 313/503 |
| 4,758,765 | 7/1988 | Mitsumori | 313/503 |
| 4,963,788 | 10/1990 | King et al. | 313/503 |

Primary Examiner—Kenneth J. Ramsey
Attorney, Agent, or Firm—Cushman, Darby & Cushman

[57] ABSTRACT

A method for manufacturing an electroluminescence display having a multi-layered substrate is disclosed. The multi-layered substrate includes a transparent electrode layer, a lower dielectric layer, a luminescent layer, an upper dielectric layer, a black layer and a rear electrode layer stacked successively on a substrate. The method requires coating an Al layer on the upper dielectric layer by placing the multi-layer coated substrate under a lower vacuum atmosphere containing a predetermined gas to form the black layer by a reaction between Al and the gas. Another Al layer is coated on the black layer under a higher vacuum atmosphere vacuum atomosphere and then baked. The baked Al layer is then etched to form the rear electrode layer.

17 Claims, 3 Drawing Sheets

METHOD FOR MANUFACTURING AN ELECTROLUMINESCENCE DISPLAY

BACKGROUND OF THE INVENTION

The present invention relates to a method for manufacturing an electroluminescence (EL) display.

FIG. 1 shows an AC thin-film EL display of the type having a matrix construction. The EL display has a glass substrate 1, a transparent electrode layer 2, a lower dielectric layer 3, a phosphor layer 4, an upper dielectric layer 5 and a rear electrode layer 6. When voltage is applied to a predetermined position between the transparent electrode layer 2 and the rear electrode layer 6, a strong electric field is formed between the upper dielectric layer 5 and the lower dielectric layer 3 causing electrons to accelerate and collide with particles of the phosphor layer 4 interposed between the layers 5 and 3, thereby emitting light. The emitted light is directed to pass through the transparent electrode layer 2 and the glass substrate 1 to display a predetermined pattern on the substrate 1. The pattern appears on the surface of the substrate 1 in a two dimensional image display due to forming the transparent electrode layer 2 and rear electrode layer 6 perpendicularly in a matrix configuration.

Unfortunately, the EL display shown in FIG. 1 has substantially low image contrast which is a problem for image display, especially in the presence of strong ambient light. The EL display brightness ratio to the ambient light is low, and thus, the image display does not clearly appear on the EL display. Accordingly, the EL display must be used in data processing display devices in which image contrast is not critical.

To solve the contrast problem of the above-mentioned EL display, a black layer 7 is provided between the upper dielectric layer 5 and the rear electrode layer 6 as shown in FIG. 2. The black layer 7 increases the amount of the light emitted to the front, thereby improving the image contrast so that the image display clearly appears on the EL display.

Conventional methods for providing the black layer 7 include the following:

I) Forming a PrMn oxide film by a radio frequency sputtering process.

II) Forming a GaAs film by an electron beam deposition process.

III) Forming a PbTi oxide by thermal decomposition of a dilute organic metal solution.

IV) Using low reflectivity Mo film containing carbon as a rear electrode layer.

V) Forming a carbon film or a black coating applied with black paint by a manual process.

In the above-described methods, the black layer 7 is formed with material different from that of the upper dielectric layer 5 or the rear electrode layer 6. Accordingly, these methods have serious drawbacks.

First, it is difficult to select a material which possesses suitable black layer characteristics, yet does not react with adjacent layers.

Second, providing a black dielectric layer requires an additional fabrication apparatus and additional process steps to separately form a thin film.

Consequently, an EL display with a black layer can not be widely used in practical application because of high production cost; while, on the other hand, an EL display without a black layer has not been used in high resolution display devices because of the low image contrast problem.

SUMMARY OF THE INVENTION

Therefore, it is an object of the present invention to provide a method for manufacturing an EL display having a high image contrast.

Another object of the present invention is to provide a method for manufacturing an EL display without any additional fabrication apparatus and additional process steps in comparison with conventional manufacturing methods.

To accomplish the above objects, one embodiment of the present invention, provides a method for manufacturing an electroluminescent display having a substrate, a transparent electrode layer, a lower dielectric layer, a luminescent layer, an upper dielectric layer, a black layer and a rear electrode layer. The layers are successively coated on the substrate in the cited order to form a multi-layer coated substrate. The method requires coating an Al layer on the upper dielectric layer by placing the multi-layer coated substrate under a lower vacuum atmosphere containing a predetermined gas to form the black layer by a reaction between the Al and the gas. Then, another Al layer is coated on the black layer under a higher vacuum atmosphere and etched into a predetermined pattern to form the rear electrode layer.

A second embodiment of the present invention provides a method for manufacturing an electroluminescent display having a substrate, a transparent electrode layer, a lower dielectric layer a luminescent layer, a upper dielectric layer and a rear electrode layer. The layers are successively coated on the substrate in the cited order to form a multi-layer coated substrate. The method requires coating an Al layer on the luminescent layer by placing the multi-layer coated substrate under a lower vacuum atmosphere containing a predetermined gas to form the upper dielectric layer by a reaction between the Al and the gas. Another Al layer is coated on the upper dielectric layer under a higher vacuum atmosphere and etched into a predetermined pattern to form the rear electrode layer.

According to the present invention, the provision of the black layer is simultaneously effected through the process forming the rear electrode layer, so that the black layer is formed without any additional manufacturing steps. Thus, an EL display having a high contrast is manufactured at low cost.

Furthermore, according to the second embodiment of the present invention, the black layer serves as both an upper dielectric layer and a rear electrode layer, thereby considerably shortening the manufacturing process of the EL display which results in a reduction of production cost.

BRIEF DESCRIPTION OF THE DRAWINGS

The above and other objects of the present invention will be more apparent with reference to the following drawings.

DETAILED DESCRIPTION OF THE PREFERRED EMBODIMENT

Figure 1:
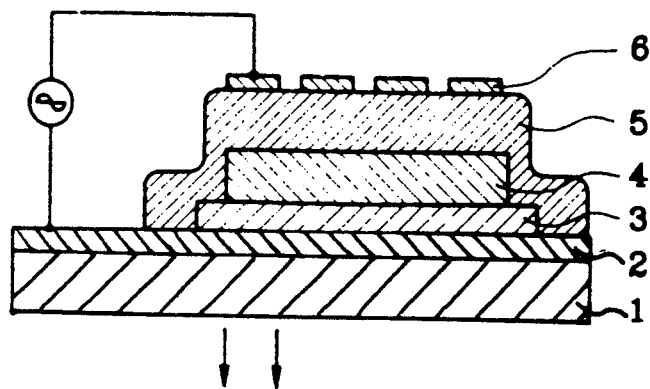
FIG. 1 shows a cross-sectional elevation view of a typical EL display.
Figure 2:
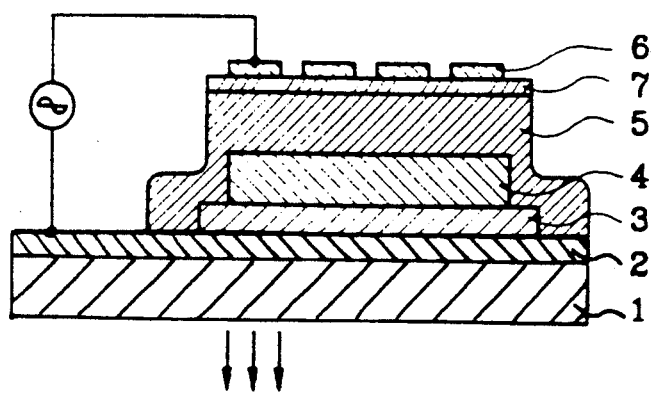
FIG. 2 shows a cross-sectional elevation view of an EL display manufactured according to a first embodiment of the present invention.

A first preferred embodiment of the present invention will be now explained with reference to FIG. 2.

On a glass substrate 1, preferably made of low alkali glass, a transparent electrode layer 2 (for example, Indium-Tin Oxide (ITO)) is formed in stripes by a sputtering process or the like to provide, for example, a column electrode. A dielectric material, such as $Y_2O_3$ or $Al_2O_3$, is deposited on the transparent electrode layer 2 through an electron beam deposition or a sputtering process to form a lower dielectric layer 3. Phosphor, preferably containing ZnS:Mn as a main component, is then deposited on the lower dielectric layer 3 via an electron beam deposition process or the like to form a luminescent layer 4. Next, an upper dielectric layer 5 is coated on the luminescent layer 4 in the same manner as described above for the lower electric layer 3. To crystallize the luminescent layer 5, a baking or annealing process is preferably effected at a temperature of 450° C. to 500° C. for a predetermined time.

After the annealing process, the multi-layer coated substrate is introduced into a vacuum chamber of a sputtering apparatus having a target, and AL is deposited on the upper dielectric layer 5 through a sputtering process.

At that time, the degree of vacuum in the chamber is initially maintained on the order of approximately $10^{-2} \sim 10^{-3}$ m bar. Argon and nitrogen (expressed as $N_2$) gas or argon, $N_2$ and $O_2$ gas are introduced into the chamber to form a gas atmosphere therein. The nitrogen gas is excited by radio frequency. Under the gas atmosphere, the aluminum supplied for the sputtering process and the excited nitrogen gas react in an ion phase or in a plasma phase.

Accordingly, aluminum nitride (expressed as AlN) or aluminum oxynitride (generally expressed as AlOxNy) is deposited on the upper dielectric layer 5 of the multi-layer coated substrate. Specifically, if the introduced gas is nitrogen, AlN is deposited, and if $N_2$ and $O_{2\,gas}$ are introduced, AlOxNy is deposited. Thus, a black layer 7 is formed by depositing AlN or AlOxNY to the thickness of, for example, 200~300 nm.

The compounds AlN and AlOxNy exhibit black appearance because both compounds possess high resistivities and dielectric constants, similar to those of $Al_2O_3$ or $Y_2O_3$ which form the lower and upper dielectric layers 3 and 5. AlN and AlOxNy also have a low light absorbing property.

Next, the $N_2$ and $O_2$ gas is removed from the chamber and the degree of vacuum of the chamber is raised to the order of $10^{-3}$ m bar by using argon gas and maintained in the above conditions. The vacuum degree in the chamber can be easily and promptly adjusted by opening or closing a needle valve normally mounted to the chamber. Then, Al is continuously deposited to form an Al deposited layer with a thickness of, for instance, above 500 nm. Thereafter, the multi-layer coated substrate is removed from the vacuum chamber and placed in an oven for baking the Al deposited layer at a temperature of approximately 200° C.

A photo lithographic process, or the like, is employed to etch the Al deposited layer into a desired striped pattern to form a rear electrode layer 6. The black layer 7 is not etched during this process because the compounds AlN and AlOxNY form a film in stable state which is resistant to etching during a conventional etching technique, such as photolithography. The rear electrode layer 6 serves as row electrodes while the transparent electrode layer 2 are column electrodes, thereby providing a matrix configuration.

Although the above-described EL display is manufactured using a sputtering procedure, a thermochemical vapor deposition procedure may also be used. That is, the degree of vacuum in the chamber is initially maintained on the order of approximately $10^{-2} \sim 10^{-3}$ m bar and then $N_2$ gas or air is introduced into the chamber to form a gas atmosphere. AlN or AlOxNy is then deposited to a thickness of, for example, 200~300 nm by thermochemical vapor deposition procedure. After stopping the introduction of the gas, the degree of vacuum of the chamber is raised above $10^{-5}$ m bar and maintained in the above state. Al is continuously deposited to form an Al deposited layer to the thickness of, for example, above 500 nm. The remaining steps in the above process are the same as the sputtering process.

According to the present invention, the black layer 7 formed under the gas atmosphere is not etched during the etching process of the rear electrode layer 6 since the Al is nitrated to form a stable compound. However, the Al layer deposited afterward in the high vacuum state is etched to define a given pattern and form the rear electrode layer 6.

The above EL display manufacturing method is advantageous in that the resistivity of AlN black layer formed through the present process is on the order of about $10^6$ Ω.cm and the dielectric constant is in the range of 8.7 to 8.9. The characteristics of the AlOxNy black layer are substantially similar to those of AlN, and consequently, both AlN and AlOxNy are sufficient for practical use as a dielectric layer or a black layer.

Figure 3:
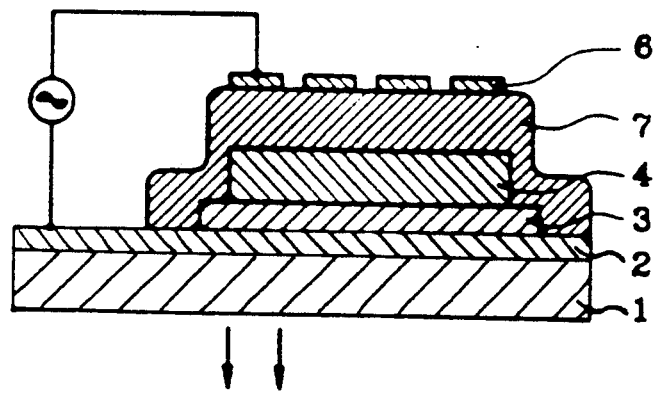
FIG. 3 shows a cross-sectional elevation view of another EL display manufactured according to a second embodiment of the present invention.

FIG. 3 illustrates another embodiment of the present invention which shortens the above-mentioned EL display manufacturing process by substituting the upper dielectric layer with a black dielectric layer 7.

A multi-layer coated substrate, formed according to the above described process, is placed into the vacuum chamber of the sputtering apparatus and a black dielectric layer 7 composed of AlN or AlOxNy is prepared by sputtering Al under a gas atmosphere in a relatively low vacuum state. Then, an Al layer is deposited in a relatively higher vacuum state. Baking and etching processes are performed successively to form a rear electrode layer 6.

Although the Al deposition is accomplished by a sputtering process on a thermochemical vapor deposition procedure in the above examples, vacuum deposition processes, such as an electron-beam deposition, may be employed in the above examples.

According to the present invention as described above, the black layer provided to enhance the image contrast of an EL display is formed by using the same material and through the same process as the process for forming the rear electrode layer. Thus, the black layer is obtained without any additional processes and without using material different from the rear electrode layer. Further, when the upper dielectric and the rear electrode layers are simultaneously formed during the formation of the black layer, the process for manufacturing an EL display is remarkably shortened.

Therefore, the method according to the invention provides an economical process for manufacturing an EL display having an improved and enhanced contrast property.

The present invention has been described in specific embodiments, but it will be understood by those skilled in the art that changes and modifications can be made without departing from the scope of the present invention defined by the following claims.

What is claimed is:

1. A method for manufacturing an electroluminescence display having a transparent electrode layer, a lower dielectric layer, a luminescent layer, an upper dielectric layer, a black layer and a rear electrode layer successively coated on a substrate to form a multi-layer coated substrate, said method comprising the steps of:

coating a first Al layer on said upper dielectric layer by placing said multi-layer coated substrate under a first vacuum atmosphere containing a predetermined gas to form said black layer by a reaction between the Al and the gas;

coating a second Al layer on said black layer under a second vacuum atmosphere, said second vacuum atmosphere being higher than said first vacuum atmosphere; and etching said second Al layer into a predetermined pattern to form said rear electrode layer.

2. A method as claimed in claim 1, wherein said coating steps are performed by a sputtering procedure.

3. A method as claimed in claim 2, wherein said second vacuum atmosphere during said sputtering procedure is approximately $10^{-3}$ m bar.

4. A method as claimed in claim 1, wherein said coating steps are performed by a thermochemical vapor deposition procedure.

5. A method as claimed in claim 4, wherein said second vacuum atmosphere during said thermochemical vapor deposition procedure is approximately around $10^{-5}$ m bar.

6. A method as claimed in claim 1, wherein said gas used in forming said black layer is nitrogen gas.

7. A method as claimed in claim 1, wherein said gas used in forming said black layer is $N_2$ and $O_2$ gas.

8. A method as claimed in claim 1, wherein said first vacuum atmosphere is approximately $10^{-2} \sim 10^{-3}$ m bar.

9. A method as claimed in claim 1, wherein said method further comprises a step of baking said second Al layer between said steps of coating and etching said second Al layer.

10. A method for manufacturing an electroluminescence display having a transparent electrode layer, a lower dielectric layer, a luminescent layer, an upper dielectric layer and a rear electrode layer successively coated on a substrate to form a multi-layer coated substrate, said method comprising the steps of;

coating a first Al layer on said luminescent layer under a first vacuum atmosphere containing a predetermined gas to form a black dielectric layer by a reaction between the Al and the gas;

coating a second Al layer on said black dielectric layer under a second vacuum atmosphere, said second vacuum atmosphere being higher than said first vacuum atmosphere; and etching said second Al layer into a predetermined pattern to form said rear electrode layer.

11. A method as claimed in claim 10, wherein said coating steps are performed by a sputtering procedure.

12. A method as claimed in claim 11, wherein said second vacuum atmosphere during said sputtering procedure is approximately $10^{-3}$ m bar.

13. A method as claimed in claim 10 wherein said gas used in forming said black layer is nitrogen gas.

14. A method as claimed in claim 10, wherein said gas used in forming said black layer is $N_2$ and $O_2$ gas.

15. A method as claim in claim 10, wherein said first vacuum atmosphere is approximately $10^{-2} \sim 10^{-3}$ m bar.

16. A method as claimed in claim 10, wherein said coating steps are performed by a thermochemical vapor deposition procedure.

17. A method as claimed in claim 16, wherein said second vacuum atmosphere during said thermochemical vapor deposition procedure is approximately $10^{-5}$ m bar.

* * * * *